United States Patent
Kluss

(10) Patent No.: US 10,481,881 B2
(45) Date of Patent: *Nov. 19, 2019

(54) MAPPING A COMPUTER CODE TO WIRES AND GATES

(71) Applicant: Archeo Futurus, Inc., Anacortes, WA (US)

(72) Inventor: Daniel Joseph Bentley Kluss, Las Vegas, NV (US)

(73) Assignee: ARCHEO FUTURUS, INC., Anacortes, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/970,884

(22) Filed: May 4, 2018

(65) Prior Publication Data

US 2018/0373508 A1 Dec. 27, 2018

Related U.S. Application Data

(63) Continuation-in-part of application No. 15/630,691, filed on Jun. 22, 2017, now Pat. No. 9,996,328.

(51) Int. Cl.
*G06F 17/50* (2006.01)
*G06F 9/44* (2018.01)
(Continued)

(52) U.S. Cl.
CPC ............... *G06F 8/44* (2013.01); *G06F 8/35* (2013.01); *G06F 8/40* (2013.01); *G06F 8/443* (2013.01);
(Continued)

(58) Field of Classification Search
CPC .......... G06F 17/5022; G06F 17/5045; G06F 17/2775; G06F 17/30985; G06F 17/273;
(Continued)

(56) References Cited

U.S. PATENT DOCUMENTS 5,036,476 A * 7/1991 Yamaguchi ........... G06F 3/1297
347/129
5,448,496 A * 9/1995 Butts .................. G06F 17/5027
716/116
(Continued)

FOREIGN PATENT DOCUMENTS

WO WO2018236384 A1 12/2018

OTHER PUBLICATIONS

Keith D. Cooper et al., Optimizing for reduce code space using genetic algorithms, May 5, 1999, [Retrieved on Nov. 22, 2016]. Retrieved from the internet: <URL: https://dl.acm.org/citation.cfm?id=314414> 9 Pages (1-9) (Year: 1999).*

(Continued)

*Primary Examiner* — Anibal Rivera
(74) *Attorney, Agent, or Firm* — Polsinelli LLP

(57) ABSTRACT

Methods and systems for mapping computer code to wires and gates are disclosed. An example method may include acquiring a code written in a programming language and generating, based on the code, a finite state machine (FSM). The method may further include generating, based on the FSM, a wires and gates representation, the wires and gates representation including a plurality of wires and a plurality of combinatorial logics. The method may further include configuring, based on the wires and gates representation, a field-programmable gate array. Input of each of the plurality of wires may represent a symbol selected from a set of symbols of a structured data packet. The size of the symbol can be equal to a number of bits of the structured data packet transferred per a clock cycle according to a data transmission protocol.

20 Claims, 6 Drawing Sheets

(51) Int. Cl.
- *G06F 17/30* (2006.01)
- *G06F 8/41* (2018.01)
- *H03K 19/177* (2006.01)
- *G06F 16/00* (2019.01)
- *G06F 8/35* (2018.01)
- *G06F 8/40* (2018.01)

(52) U.S. Cl.
CPC .............. *G06F 9/44* (2013.01); *G06F 16/00* (2019.01); *G06F 17/50* (2013.01); *H03K 19/17704* (2013.01); *G06F 8/4434* (2013.01); *G06F 17/5022* (2013.01); *G06F 17/5054* (2013.01); *G06F 17/5077* (2013.01)

(58) Field of Classification Search
CPC ........... G06F 17/2264; G06F 17/30958; G06F 8/4434; G06F 8/443; G06F 8/4442; G06F 8/433; G06F 8/427; G06F 21/552
See application file for complete search history.

(56) References Cited

U.S. PATENT DOCUMENTS

| | | | | |
|---|---|---|---|---|
| 5,477,451 A | * | 12/1995 | Brown | G06F 17/2755 704/2 |
| 5,510,981 A | * | 4/1996 | Berger | G06F 17/2818 704/2 |
| 5,606,690 A | * | 2/1997 | Hunter | G06F 17/273 715/255 |
| 5,960,200 A | * | 9/1999 | Eager | G06F 8/427 703/13 |
| 5,978,801 A | * | 11/1999 | Yuasa | G06F 16/90344 |
| 6,002,861 A | * | 12/1999 | Butts | G06F 17/5027 703/15 |
| 6,018,735 A | * | 1/2000 | Hunter | G06F 16/90344 |
| 6,223,189 B1 | * | 4/2001 | Steffens | G06F 17/2264 715/209 |
| 6,308,149 B1 | * | 10/2001 | Gaussier | G06F 16/3344 704/9 |
| 7,136,947 B1 | * | 11/2006 | Passerone | G06F 17/5045 710/100 |
| 7,185,081 B1 | * | 2/2007 | Liao | H04L 47/2441 709/224 |
| 7,188,168 B1 | * | 3/2007 | Liao | H04L 43/18 709/224 |
| 7,398,197 B1 | * | 7/2008 | Mohri | G10L 15/193 704/1 |
| 7,503,027 B1 | * | 3/2009 | Zhao | G01R 31/31726 716/104 |
| 7,904,850 B2 | * | 3/2011 | Spackman | G06F 17/5045 703/13 |
| 7,991,723 B1 | * | 8/2011 | Dubrovsky | G06F 21/552 706/45 |
| 8,024,691 B2 | | 9/2011 | Zilic et al. | |
| 8,180,964 B1 | * | 5/2012 | Koh | G06F 11/3442 711/118 |
| 8,706,964 B1 | * | 4/2014 | Koh | G06F 12/0888 711/118 |
| 8,806,456 B2 | * | 8/2014 | Gazzillo | G06F 8/423 717/142 |
| 8,966,457 B2 | * | 2/2015 | Ebcioglu | G06F 17/5045 716/105 |
| 9,177,253 B2 | * | 11/2015 | Ruehle | G06N 5/025 |
| 9,262,555 B2 | | 2/2016 | Coalson et al. | |
| 9,426,166 B2 | * | 8/2016 | Billa | H04L 63/1408 |
| 9,448,965 B2 | | 9/2016 | Brown et al. | |
| 9,996,328 B1 | | 6/2018 | Kluss | |
| 2003/0018461 A1 | * | 1/2003 | Beer | G06F 17/504 703/14 |
| 2003/0196194 A1 | * | 10/2003 | Johns | G06F 17/5045 717/136 |
| 2003/0221013 A1 | * | 11/2003 | Lockwood | H04L 41/08 709/231 |
| 2004/0019883 A1 | * | 1/2004 | Banerjee | G06F 8/4434 717/152 |
| 2004/0103408 A1 | * | 5/2004 | Chilimbi | G06F 8/4442 717/140 |
| 2004/0172234 A1 | * | 9/2004 | Dapp | G06F 8/427 704/1 |
| 2004/0215593 A1 | * | 10/2004 | Sharangpani | G06F 7/00 |
| 2004/0225999 A1 | * | 11/2004 | Nuss | G06F 8/31 717/114 |
| 2005/0177736 A1 | * | 8/2005 | de los Santos | G06F 21/563 713/188 |
| 2005/0257202 A1 | * | 11/2005 | Kaestner | G06F 9/45516 717/153 |
| 2006/0117307 A1 | * | 6/2006 | Averbuch | G06F 17/2247 717/143 |
| 2006/0235811 A1 | * | 10/2006 | Fairweather | G06F 8/427 706/12 |
| 2007/0130140 A1 | * | 6/2007 | Cytron | G06F 16/90344 |
| 2007/0226362 A1 | * | 9/2007 | Johnson | H04L 43/18 709/230 |
| 2008/0071802 A1 | * | 3/2008 | Lucco | G06F 17/2247 |
| 2008/0082946 A1 | * | 4/2008 | Zilic | G06F 17/504 716/103 |
| 2008/0140662 A1 | * | 6/2008 | Pandya | G11C 15/00 |
| 2009/0083265 A1 | * | 3/2009 | Michailov | G06F 16/90344 |
| 2010/0094906 A1 | * | 4/2010 | Della-Libera | G06F 9/4498 707/797 |
| 2010/0138367 A1 | * | 6/2010 | Yamagaki | G06N 5/003 706/12 |
| 2010/0161536 A1 | * | 6/2010 | Clark | G06F 21/552 706/46 |
| 2010/0281160 A1 | * | 11/2010 | Ros-Giralt | H04L 43/18 709/224 |
| 2011/0022617 A1 | * | 1/2011 | Yamagaki | G06F 7/02 707/758 |
| 2011/0307503 A1 | * | 12/2011 | Dlugosch | G06N 20/00 707/758 |
| 2012/0072380 A1 | * | 3/2012 | Liu | H04L 45/7457 706/12 |
| 2012/0191446 A1 | * | 7/2012 | Binsztok | G06F 8/30 704/9 |
| 2012/0192163 A1 | * | 7/2012 | Glendenning | G06F 17/5045 717/143 |
| 2012/0192164 A1 | * | 7/2012 | Xu | G06F 8/447 717/149 |
| 2012/0192165 A1 | * | 7/2012 | Xu | G06F 8/45 717/149 |
| 2012/0192166 A1 | * | 7/2012 | Xu | G06F 17/505 717/149 |
| 2012/0221497 A1 | * | 8/2012 | Goyal | H04L 63/1416 706/12 |
| 2013/0007530 A1 | * | 1/2013 | Atasu | G06F 11/3608 714/40 |
| 2013/0046784 A1 | * | 2/2013 | Ruehle | G06K 9/6878 707/776 |
| 2013/0125097 A1 | * | 5/2013 | Ebcioglu | G06F 17/5045 717/136 |
| 2013/0133064 A1 | * | 5/2013 | Goyal | H04L 63/0254 726/22 |
| 2013/0156043 A1 | * | 6/2013 | Brown | G06K 9/00973 370/428 |
| 2013/0159239 A1 | * | 6/2013 | Brown | G06K 9/00986 706/48 |
| 2013/0159671 A1 | * | 6/2013 | Brown | G06K 9/00986 712/36 |
| 2013/0174131 A1 | | 7/2013 | Takeuchi | |
| 2013/0282649 A1 | * | 10/2013 | Guanella | G06N 5/00 706/59 |
| 2013/0346929 A1 | * | 12/2013 | Toi | G06F 17/505 716/104 |
| 2014/0025614 A1 | * | 1/2014 | Noyes | G06F 15/7867 706/29 |
| 2014/0025905 A1 | * | 1/2014 | Brown | G06F 9/4498 711/154 |
| 2014/0067736 A1 | * | 3/2014 | Noyes | G06F 1/3206 706/20 |

(56) References Cited

U.S. PATENT DOCUMENTS

| | | | |
|---|---|---|---|
| 2014/0068167 A1* | 3/2014 | Brown | G05B 19/045 711/105 |
| 2014/0068234 A1* | 3/2014 | Brown | G05B 19/045 712/227 |
| 2014/0089249 A1 | 3/2014 | Dubrovsky et al. | |
| 2014/0244554 A1* | 8/2014 | Atasu | G06F 9/4498 706/12 |
| 2014/0279776 A1* | 9/2014 | Brown | G06F 15/7867 706/20 |
| 2014/0280358 A1* | 9/2014 | Coalson | G06F 16/9024 707/798 |
| 2014/0282393 A1* | 9/2014 | Coalson | G06F 8/31 717/117 |
| 2015/0039550 A1* | 2/2015 | Cheetancheri | G06N 5/025 706/48 |
| 2015/0067200 A1* | 3/2015 | Goyal | G06F 16/90344 710/24 |
| 2015/0067776 A1* | 3/2015 | Billa | H04L 63/1408 726/3 |
| 2015/0082207 A1* | 3/2015 | Prasad | G06F 3/048 715/762 |
| 2015/0121337 A1* | 4/2015 | Makarov | G06F 9/4498 717/115 |
| 2015/0135171 A1 | 5/2015 | Ishii et al. | |
| 2015/0242194 A1* | 8/2015 | Vargas | G06F 8/51 717/137 |
| 2015/0277865 A1 | 10/2015 | Gorissen et al. | |
| 2015/0277915 A1* | 10/2015 | Kelm | G06F 9/4552 712/226 |
| 2015/0293846 A1* | 10/2015 | Goyal | H04L 63/1425 711/122 |
| 2015/0293910 A1* | 10/2015 | Mathur | G06F 17/2818 704/2 |
| 2015/0295889 A1* | 10/2015 | Goyal | G06N 5/047 726/11 |
| 2016/0012033 A1* | 1/2016 | Craymer | G06F 17/271 704/9 |
| 2016/0259874 A1* | 9/2016 | Andrade | G06F 9/4498 |
| 2016/0299872 A1* | 10/2016 | Vaidyanathan | G06F 15/7871 |
| 2017/0097852 A1* | 4/2017 | Glendenning | G06F 9/4498 |
| 2017/0131983 A1* | 5/2017 | Roytman | G06F 9/4552 |

OTHER PUBLICATIONS

Trishul M. Chilimbi et al., Dynamic hot data stream prefetching for general-purpose programs, Jun. 17-19, 2002, [Retrieved on Nov. 22, 2016]. Retrieved from the internet: <URL: https://dl.acm.org/citation.cfm?id=512554> 11 Pages (199-209) (Year: 2002).*

Trevor Jim et al., Semantics and Algorithms for Data-dependent Grammars, Jan. 17-23, 2010, [Retrieved on Jul. 12, 2019]. Retrieved from the internet: <URL: http://delivery.acm.org/10.1145/1710000/1706347/p417-jinn.pdf> 14 Pages (417-430) (Year: 2010).*

Hiroki Nakahara et al., A Regular Expression Matching Using Non-Deterministic Finite Automation, 2010 IEEE, [Retrieved on Jul. 12, 2019]. Retrieved from the internet: <URL: http://delivery.acm.org/10.1145/3050000/3041605/05558621.pdf> 4 Pages (73-76) (Year : 2010).*

"International Search Report" and "Written Opinion of the International Searching Authority," Patent Cooperation Treaty Application No. PCT/US2017/038825, dated Sep. 1, 2017, 8 pages.

Barrett, William A., "Compiler Design," Fall 2005, Dec. 21, 2005, Retrieved from the Internet: <http://citseerx.ist.psu.edu/viewdoc/download?doi=10.1.1.462.9894&rep=rep1&type=pdf>, pp. 39, 592.

Jeuring, Johan et al., "Grammar and Parsing," [online], 2001 [retrieved on Jan. 31, 2018], Retrieved from the Internet: <URL:http://www.cs.uu.nl/docs/vakken/gont/diktaat.pdf>, 275 pages.

Medeiros, Sergio et al., "From Regexes to Parsing Expression Grammars," [online], Oct. 17, 2012 [retrieved on Jan. 31, 2018], Retrieved from the Internet: <URL:https://arxiv.org/pdf/1210.4992.pdf>, 34 pages.

Deremer, Franklin L., "Generating parsers from BNF grammars," [online], May 14-16, 1969 [retrieved on Jan. 31, 2018], Retrieved from the Internet: <URL:https://dl.acm.org/citation.cfm?id=1476928>, 8 pages.

PCT Application PCT/US2017/030627 International Search Report and Written Opinion dated Jun. 16, 2019.

* cited by examiner

US 10,481,881 B2

MAPPING A COMPUTER CODE TO WIRES AND GATES

CROSS-REFERENCE TO RELATED APPLICATION

This application is a continuation-in-part application of U.S. patent application Ser. No. 15/630,691, titled "Compiling and Optimizing a Computer Code by Minimizing a Number of States in a Finite Machine Corresponding to the Computer Code" filed Jun. 6, 2017 and issued Jun. 12, 2018, as U.S. Pat. No. 9,996,328, the subject matter of which is incorporated herein for all purposes.

TECHNICAL FIELD

This disclosure relates generally to data processing and, more specifically, to methods and systems for mapping a computer code to wires and gates.

BACKGROUND

The approaches described in this section could be pursued but are not necessarily approaches that have been previously conceived or pursued. Therefore, unless otherwise indicated, it should not be assumed that any of the approaches described in this section qualify as prior art merely by virtue of their inclusion in this section.

Integrated circuits, such as field-programmable gate array (FPGA) or application-specific integrated circuits (ASIC), can be used in many computing applications. For example, integrated circuits can be used in servers and computing clouds to process Hypertext Transfer Protocol (HTTP) and other requests from client devices, which may provide a faster response than standard software-based applications. Despite the advantages of using integrated circuits in computing applications, designing, programming, and configuring integrated circuits remain a difficult task.

SUMMARY

This summary is provided to introduce a selection of concepts in a simplified form that is further described below in the Detailed Description. This summary is not intended to identify key features or essential features of the claimed subject matter, nor is it intended to be used as an aid in determining the scope of the claimed subject matter.

Embodiments disclosed herein are directed to methods and systems for mapping a computer code to wires and gates. According to an example embodiment, a method includes acquiring a code that is written in a programming language. The method may further include generating, based on the code, a finite state machine (FSM). The method may further include generating, based on the FSM, a wires and gates representation. The wires and gates representation may include a plurality of wires and plurality of combinatorial logics.

The method may further include configuring, based on the wires and gates representation, a field-programmable gate array. The method may also include determining that one or more combinatorial logics of the plurality of combinatorial logics does not depend on input from wires of the plurality of wires. The method may further include storing the one or more combinatorial logic in a shift register in response to the determination that one or more combinatorial logics of the plurality of combinatorial logics does not depend on input from wires of the plurality of wires.

The method may further include determining that one or more combinatorial logics of the plurality of combinatorial logics depend on input from wires of the plurality of wires. The method further may include storing the one or more combinatorial logic in flip-flops in response to the determination that one or more combinatorial logics of the plurality of combinatorial logics depend on input from wires of the plurality of wires.

In certain embodiments, input of each of the plurality of wires may represent a symbol selected from a set of symbols of a structured data packet. The size of the symbol can be selected to be equal to a number of bits of the structured data packet transferred per clock cycle according to a data transmission protocol. A number of gates and a number of wires in the wires and gates representation can be optimized based on a rate of bits transferred per clock cycle of the transferring protocol or structure of the structured data packet. The structured data packet can include an ethernet packet, optical transport network packet, or peripheral component interconnect express packet.

The programming language can include a high-level programming language such as JavaScript, C, C++, or a domain specific language. The method may further include optimizing the FSM prior to generating the wires and gates representation. Optimizing the FSM includes minimizing a number of states in the FSM.

According to one example embodiment of the present disclosure, a system for mapping a computer code to wires and gates is provided. The system may include at least one processor and a memory storing processor-executable codes, wherein the at least one processor can be configured to implement the operations of the above-mentioned method for mapping a computer code to wires and gates.

According to another example embodiment of the present disclosure, the steps of the method for mapping a computer code to wires and gates are stored on a machine-readable medium comprising instructions, which, when implemented by one or more processors, perform the recited steps.

BRIEF DESCRIPTION OF THE DRAWINGS

Embodiments are illustrated by way of example and not limitation in the figures of the accompanying drawings, in which like references indicate similar elements.

DETAILED DESCRIPTION

The following detailed description includes references to the accompanying drawings, which form a part of the detailed description. The drawings show illustrations in accordance with exemplary embodiments. These exemplary embodiments, which are also referred to herein as "examples," are described in enough detail to enable those skilled in the art to practice the present subject matter. The embodiments can be combined, other embodiments can be utilized, or structural, logical and electrical changes can be made without departing from the scope of what is claimed. The following detailed description is, therefore, not to be taken in a limiting sense, and the scope is defined by the appended claims and their equivalents.

The technology described herein allows translating a computer code from a high-level programming language to wires and gates representation. Some embodiments of the present disclosure may facilitate optimizing the source code according to requirements of a hardware description. Embodiments of the present disclosure may further allow configuring, based on the wires and gates representation, programmable integrated circuits.

According to an example embodiment, the method for mapping a computer code to wires and gates may include acquiring a code written in a programming language and generating a FSM based on the acquired code. The method may further include generating, based on the FSM, a wires and gates representation. The wires and gates representation may include a plurality of wires and plurality of combinatorial logics. The method may further include configuring, based on the wires and gates representation, a field-programmable gate array.

Figure 1:
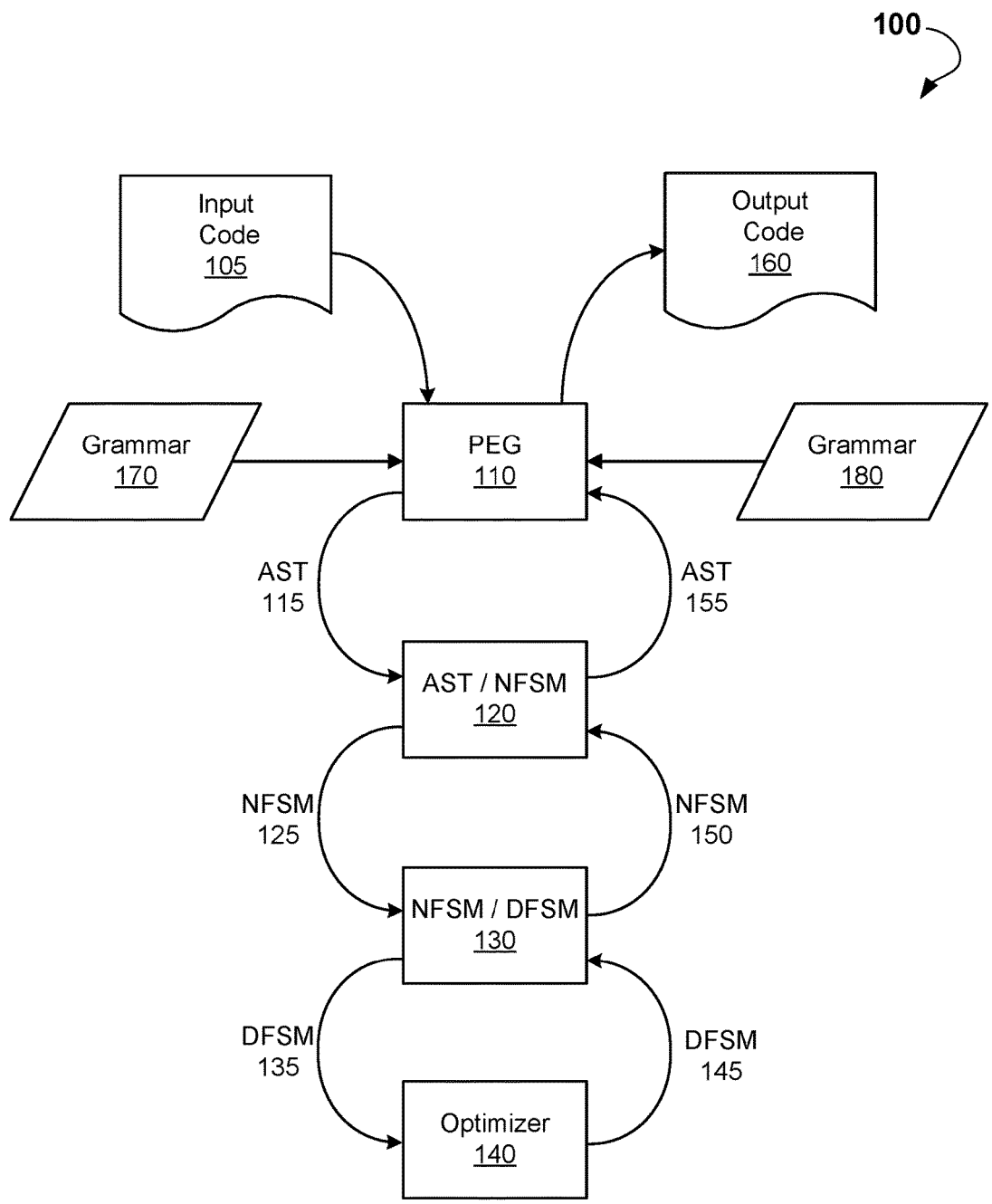
FIG. 1 is a block diagram showing a system for compiling source code, according to some example embodiments.

FIG. 1 is a block diagram showing an example system 100 for compiling source code, according to some example embodiments. The example system 100 may include a parsing expression grammar (PEG) module 110, a converter 120 between abstract syntax tree (AST) and a non-deterministic finite state machine (NFSM), a converter 130 between NFSM and deterministic finite state machine (DFSM), and an optimizer 140. The system 100 can be implemented with a computer system. An example computer system is described below with reference to FIG. 4.

In some embodiments of the present disclosure, the PEG module 110 may be configured to receive an input code 105. In some embodiments, the input code 105 may be written in an input programming language. The input programming language may be associated with a grammar 170. In some embodiments, the grammar 170 may be determined by an augmented Backus-Naur Form (ABNF). The PEG module may be configured to convert the input code 105 into an AST 115 based on the grammar 170. The AST 115 may be further provided to converter 120.

In some embodiments of the disclosure, the converter 120 may be configured to transform the AST 115 into NFSM 125. Thereafter, NFSM 125 may be provided to the converter 130. The converter 130 may be configured to translate the NFSM 125 into DFSM 135. The DFSM 135 can be provided to optimizer 140.

In some embodiments, optimizer 140 may be configured to optimize the DFSM 135 to obtain a DFSM 145. In some embodiments, the optimization may include minimizing a number of states in the DFSM 135. In various embodiments, optimization can be performed by an implication chart method, Hoperoft's algorithm, Moore reduction procedure, Brzozowski's algorithm, and other techniques. Brzozowski's algorithm includes reversing the edges of a DFSM to produce a NFSM and converting this NFSM to a DFSM using a standard powerset construction by constructing only the reachable states of the converted DFSM. Repeating the reversing a second time produces a DFSM with a provable minimum of number of states in the DFSM.

In some embodiments, the DFSM 145, which is an optimized DFSM 135, can be further provided to converter 130. The converter 130 may be configured to translate the DFSM 145 into a NFSM 150. The NFSM 150 may be further provided to converter 120. The converter 120 may be configured to translate the NFSM 150 into an AST 155. The AST 155 may be further provided to PEG module 110.

In some embodiments, the PEG module 110 may be configured to convert the AST 155 into output code 160 based on a grammar 180. The grammar 180 may specify an output programming language.

In some embodiments, the input languages or output languages may include one of high level programming languages, such as but not limited to C, C++, C#, JavaScript, PHP, Python, Perl, and the like. In various embodiments, the input code or output source code can be optimized to run on various hardware platforms like Advanced RISC Machine (ARM), x86-64, graphics processing unit (GPU), a field-programmable gate array (FPGA), or a custom application-specific integrated circuit (ASIC). In various embodiments, the input code or source code can be optimized to run on various operational systems and platforms, such as Linux, Windows, Mac OS, Android, iOS, OpenCL/CUDA, bare metal, FPGA, and a custom ASIC.

In certain embodiments, the output programming language can be the same as the input programming languages. In these embodiments, the system 100 can be used to optimize the input code 105 by converting the input code 105 to the DFSM 135, optimizing the DFSM 135 in terms of number of states, and converting the optimized DFSM 135 to output code 160 in the original programming language.

In some other embodiments, the input programming language may include a domain specific language (DSL) which is determined by a strict grammar (i.e., ABNF). In these embodiments, the system 100 may be used to convert documents written in a DSL to an output code 160 written in a high-level programming language or a code written in a low-level programming language. In certain embodiments, input code 105 or output code 160 can be written in a presentation language, including, but not limited to, HTML, XML, and XHTML. In some embodiments, input code 105 or output code 160 may include CSS.

In some embodiments, the system 100 may further include a database. The database may be configured to store frequently occurring patterns in the input code written in specific programming languages and parts of optimized DFSM corresponding to the frequently occurring patterns. In these embodiments, the system 100 may include an additional module for looking up a specific pattern of the input code 105 in the database. If the database includes an entry containing a specific pattern and corresponding parts of DFSM, then system 100 may be configured to substitute the specific pattern with the corresponding part of DFSM directly, and by skipping steps for converting the specific pattern to the AST and generating the NFSM and the DFSM.

In some embodiments, the input code or output code may include a binary assembly executable by a processor.

In some embodiments, the input code 105 or output code 160 may be written in a HDL, such as SystemC, Verilog, and Very High Speed Integrated Circuits Hardware Description Language (VHDL). The input code 105 or output code 160 may include bits native to the FPGA as programmed using Joint Test Action Group (JTAG) standards. In certain embodiments, DFSM 135 can be optimized using a constraint solver. The constraint solver may include some requirements on a hardware platform described by the HDL. For example, the requirements may include requirements for a runtime, power usage, and cost of the hardware platform. The optimization of the DFSM 135 can be carried out to satisfy one of the restrictions of the requirements. In certain embodiments, the optimization of the DFSM may be performed to satisfy several requirement restrictions with weights assigned to each of the restrictions. In some embodiments, the DFSM 135 may be formally verified in accordance with a formal specification to detect software-related security vulnerabilities, including but not limited to, memory leak, division-by-zero, out-of-bounds array access, and others.

In certain embodiments, the input source can be written in terms of a technical specification. An example technical specification can include a Request for Comments (RFC). In some embodiments, the technical specification may be associated with a specific grammar. Using the specific grammar, the input code, written in terms of the technical specification, can be translated into the AST 115 and further into the DFSM 135. In some embodiments, the DFSM 135 can be optimized using a constraint solver. The constraint solver may include restrictions described in the technical specification.

Figure 2:
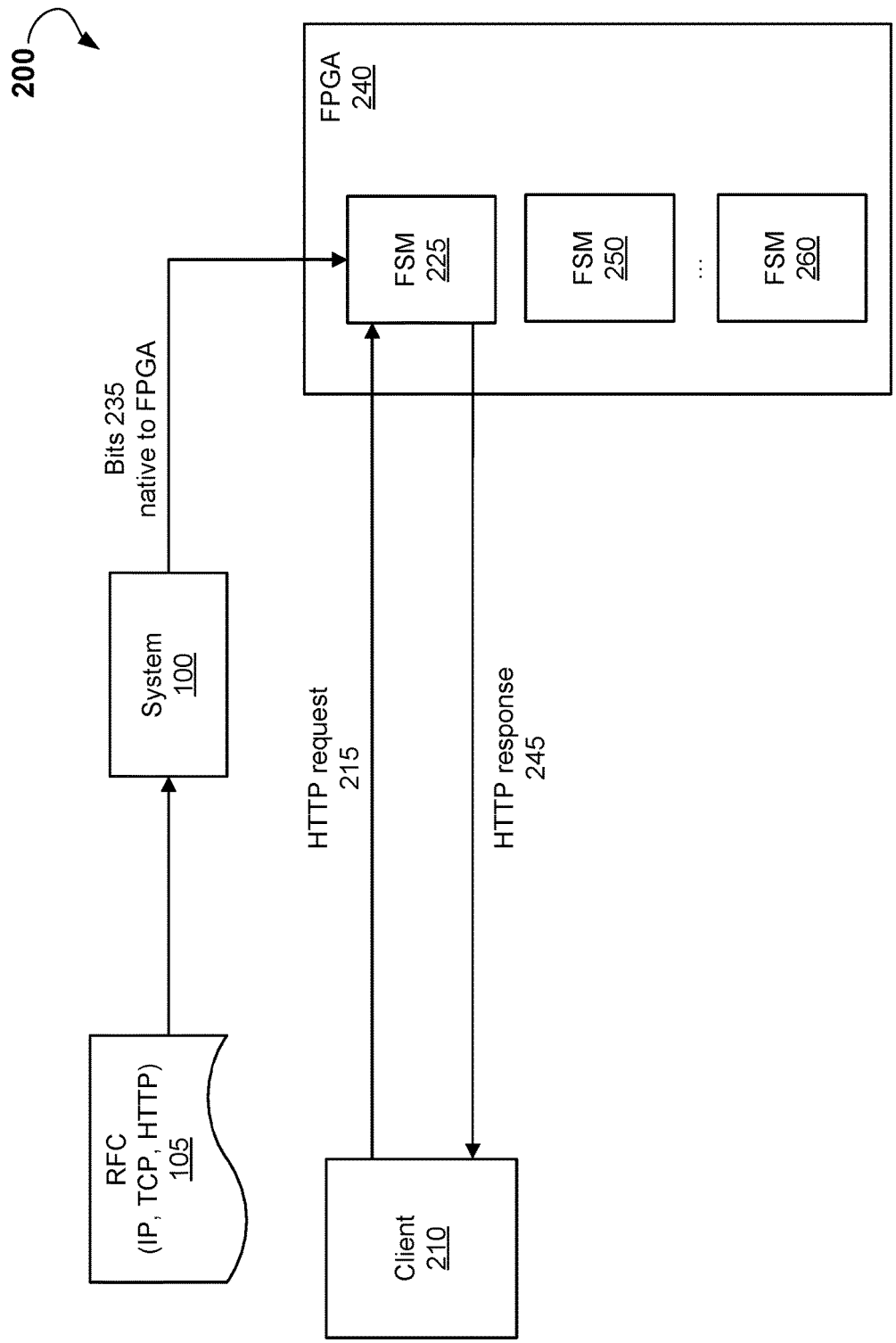
FIG. 2 is a block diagram showing an example system for processing of a Hypertext Transfer Protocol (HTTP) request, according to an example embodiment.

FIG. 2 is a block diagram showing an example system 200 for processing of HTTP requests, according to an example embodiment. The system 200 may include a client 210, the system 100 for compiling source codes, and a FPGA 240.

In certain embodiments, the system 100 may be configured to receive an RFC 105 for Internet protocol (IP), Transmission Control Protocol (TCP), and HTTP. The system 100 may be configured to program the RFC into a VHDL code, and, in turn, compile the VHDL code into bits 235 native to FPGA 240. The FPGA 240 may be programmed with bits 235. In an example illustrated by FIG. 2, the FPGA 240 includes a finite state machine, FSM 225, corresponding to bits 235. In other embodiments, the bits 235 may be stored in a flash memory and the FPGA 240 may be configured to request bits 235 from the flash memory upon startup.

In some embodiments, the client 210 may be configured to send a HTTP request 215 to the FPGA 240. In some embodiments, the HTTP request 215 can be read by the FPGA 240. The FSM 225 may be configured to recognize the HTTP request 215 and return an HTTP response 245 corresponding to the HTTP request 215 back to the client 210. In certain embodiments, the FPGA 240 may include a fabric of FSM 250-260 to keep customers' application logics for recognizing different HTTP requests and providing different HTTP responses.

The system 200 may be an improvement over conventional HTTP servers because the system 200 does not require large computing resources and maintenance of software for treatment of HTTP requests. The system does not need to be physically large and requires a smaller amount of power than conventional HTTP servers.

Figure 3:
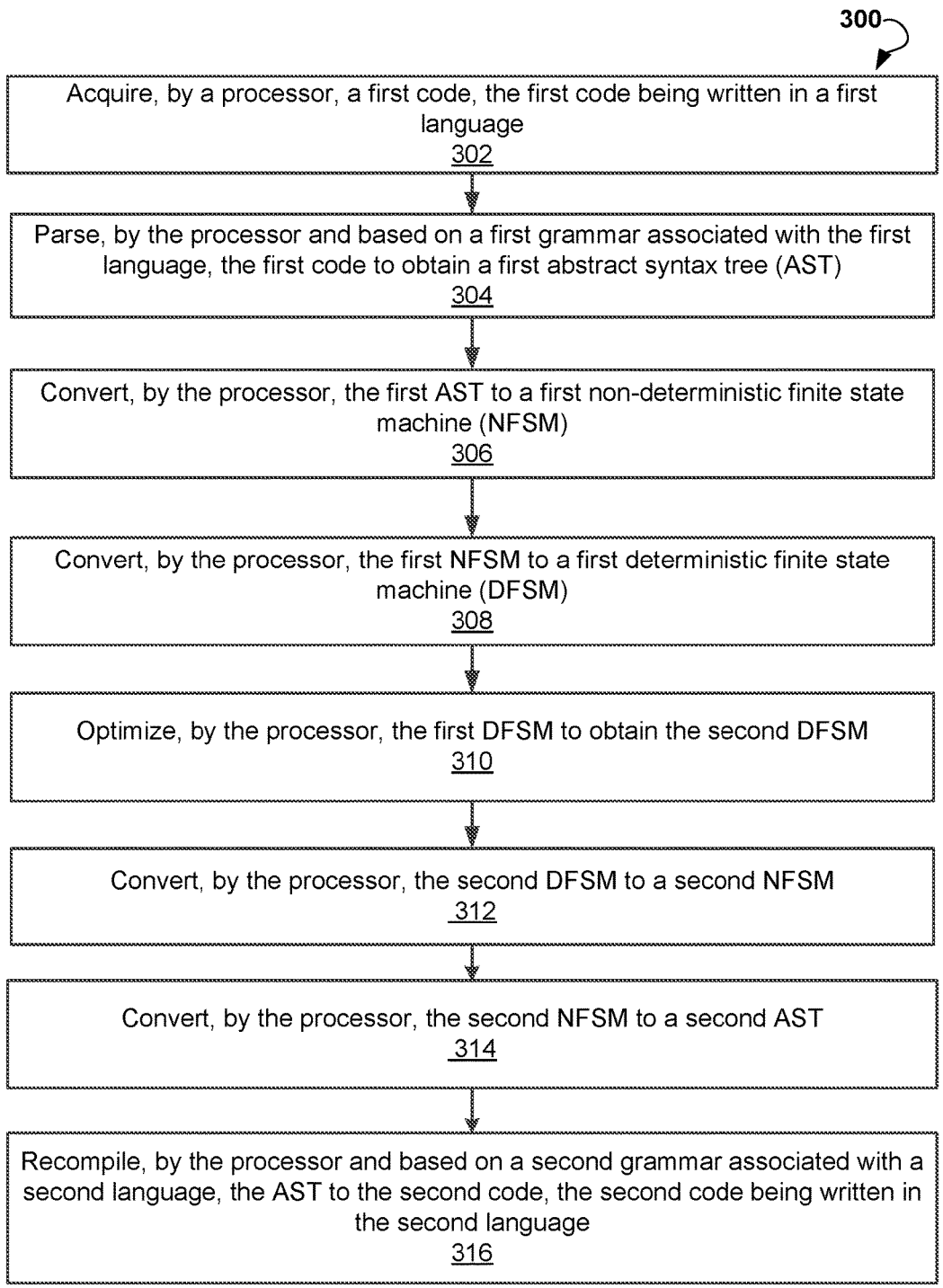
FIG. 3 is a process flow diagram showing a method for compiling source code, according to an example embodiment.

FIG. 3 is a process flow diagram showing a method 300 for compiling source codes, according to an example embodiment. The method 300 can be implemented with a computer system. An example computer system is described below with reference to FIG. 4.

The method 300 may commence, in block 302, with acquiring a first code, the first code being written in a first language. In block 304, method 300 may include parsing, based on a first grammar associated with the first language, the first code to obtain a first AST. In block 306, the method 300 may include converting the first AST to a NFSM. In block 308, the method 300 may include converting the first NFSM to a first DFSM. In block 310, the method 300 may include optimizing the first DFSM to obtain the second DFSM. In block 312, the method may include converting the second DFSM to a second NFSM. In block 314, the method 300 may include converting the second NFSM to a second AST. In block 316, the method 300 may include recompiling, based on a second grammar associated with a second language, the AST into the second code, the second code being written in the second language.

Figure 4:
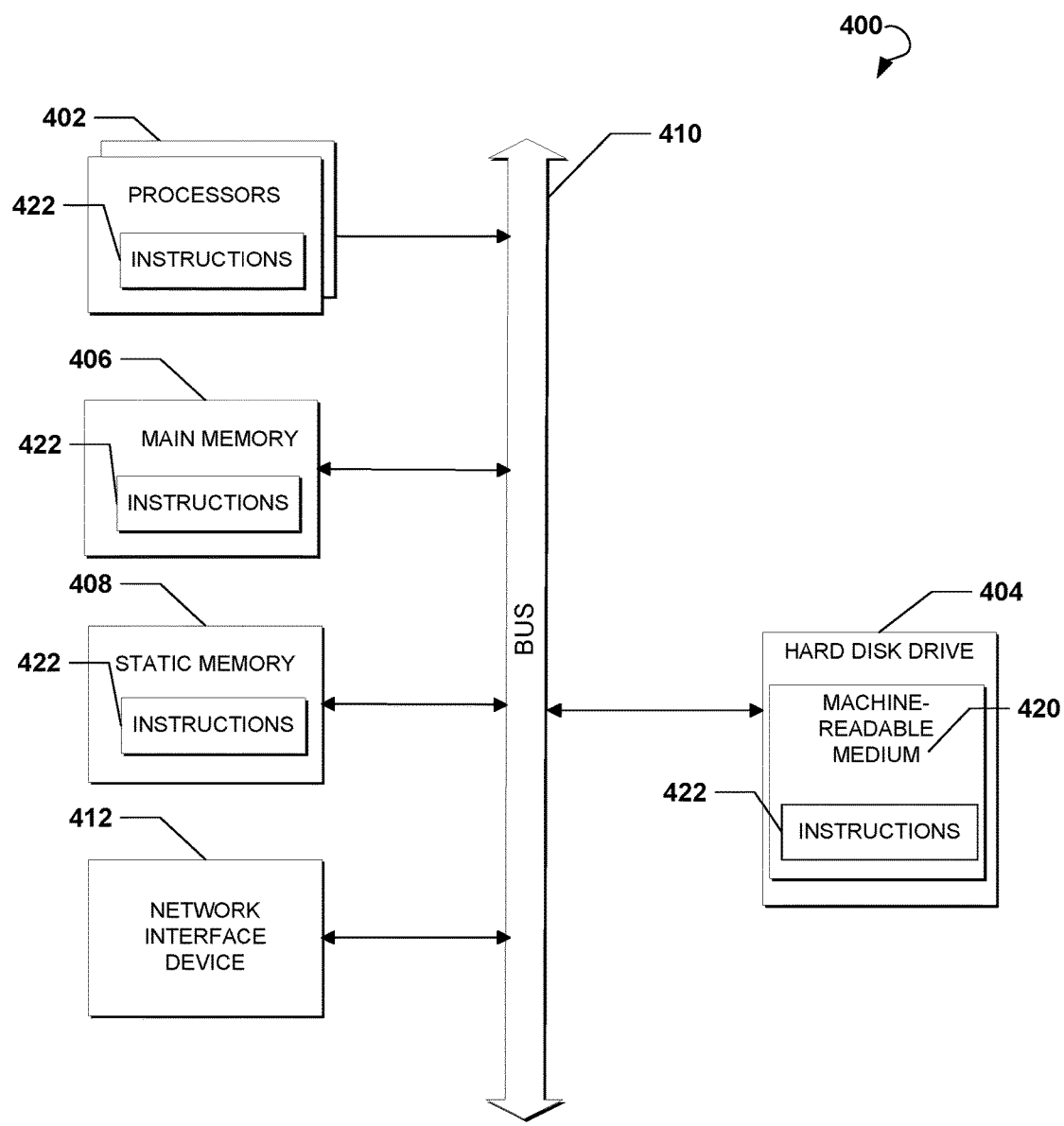
FIG. 4 shows a diagrammatic representation of a computing device for a machine in the example electronic form of a computer system, within which a set of instructions for causing the machine to perform any one or more of the methodologies discussed herein can be executed.

FIG. 4 shows a diagrammatic representation of a computing device for a machine in the exemplary electronic form of a computer system 400, within which a set of instructions for causing the machine to perform any one or more of the methodologies discussed herein can be executed. In various exemplary embodiments, the machine operates as a standalone device or can be connected (e.g., networked) to other machines. In a networked deployment, the machine can operate in the capacity of a server or a client machine in a server-client network environment, or as a peer machine in a peer-to-peer (or distributed) network environment. The machine can be a server, a personal computer (PC), a tablet PC, a set-top box (STB), a PDA, a cellular telephone, a digital camera, a portable music player (e.g., a portable hard drive audio device, such as a Moving Picture Experts Group Audio Layer 3 (MP3) player), a web appliance, a network router, a switch, a bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 400 includes a processor or multiple processors 402, a hard disk drive 404, a main memory 406, and a static memory 408, which communicate with each other via a bus 410. The computer system 400 may also include a network interface device 412. The hard disk drive 404 may include a computer-readable medium 420, which stores one or more sets of instructions 422 embodying or utilized by any one or more of the methodologies or functions described herein. The instructions 422 can also reside, completely or at least partially, within the main memory 406 and/or within the processors 402 during execution thereof by the computer system 400. The main memory 406 and the processors 402 also constitute machine-readable media.

While the computer-readable medium 420 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, and optical and magnetic media. Such media can also include, without limitation, hard disks, floppy disks, NAND or NOR flash memory, digital video disks, RAM, ROM, and the like.

The exemplary embodiments described herein can be implemented in an operating environment comprising computer-executable instructions (e.g., software) installed on a computer, in hardware, or in a combination of software and hardware. The computer-executable instructions can be written in a computer programming language or can be embodied in firmware logic. If written in a programming language conforming to a recognized standard, such instructions can be executed on a variety of hardware platforms and for interfaces to a variety of operating systems. Although not limited thereto, computer software programs for implementing the present method can be written in any number of suitable programming languages such as, for example, C, Python, Javascript, Go, or other compilers, assemblers, interpreters or other computer languages or platforms.

Figure 5:
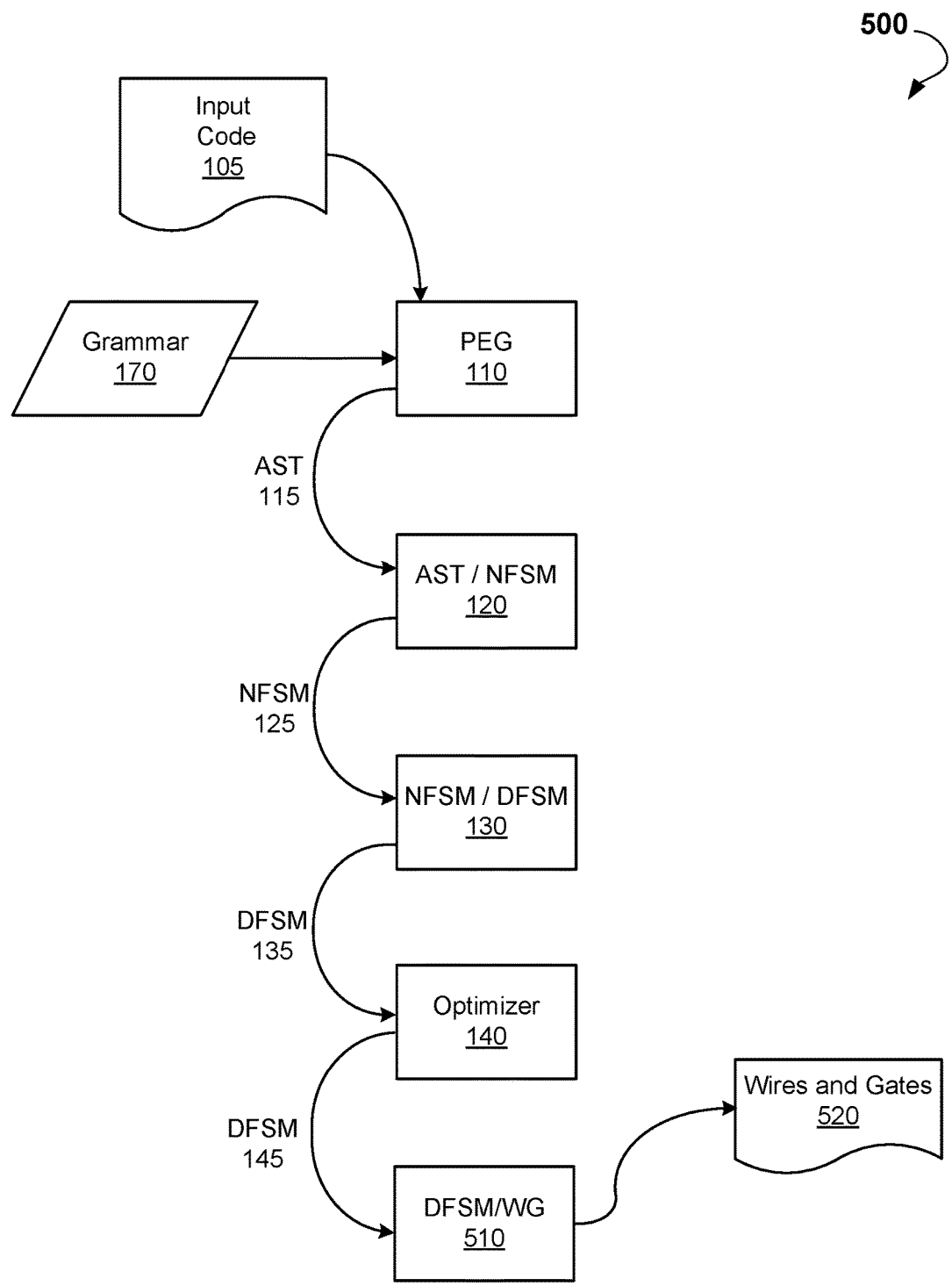
FIG. 5 is a block diagram showing a system for mapping a computer code to wires and gates, according to some example embodiments

FIG. 5 is a block diagram showing an example system 500 for mapping a computer code to wires and gates, according to some example embodiments. The example system 500 may include a parsing expression grammar (PEG) module 110, a converter 120 to convert between AST and NFSM, a converter 130 to convert between NFSM and DFSM, an optimizer 140, and translator 510 to translate from DFSM to wires and gates. The system 100 can be implemented with a computer system. An example computer system is described below with reference to FIG. 4.

The PEG module 110, the converter 120, the converter 130, and the optimizer 140 are described above with reference to the system 100 of FIG. 1. The PEG module 110 may receive an input code 105 written in an input programming language. The input programming language can be associated with a grammar 170. The PEG module can be configured to convert the input code 105 into an AST 115. The converter 120 may further transform the AST 115 into a NFSM 125. The converter 130 may be configured to translate the NFSM 125 into a DFSM 135. Optimizer 140 may further optimize the DFSM 135 to obtain a DFSM 145, which is optimized DFSM 135.

In some embodiments, the DFSM 145, can be further provided to translator 510. The translator 510 may be configured to translate the optimized DFSM 145 into a set 520 of wires and gates. The edges of DFSM 145 can be represented as wires. The states can be represented as a combinatorial logic of the wires or a simple gate. The set 520 of wires and gates can be used to match inputs, internal states, and outputs. The set 520 of wires and gates can be also used to design, program, or configure integrated circuits, such as but not limited to FPGAs and ACISs. For example, the set 520 of wires and gates can be used to configure programmable logic blocks and reconfigurable reconnects of FPGA 240 (shown in FIG. 2) to process HTTP requests.

The integrated circuits (e.g., FPGA) may receive packets via a network. The packets can include ethernet packets, Optical Transport Network (OTN) packets, Peripheral Component Interconnect Express (PCIE) packets or the like. The packets include an ordered set of inputs in time with a defined beginning, a number of input symbols, and an end. For example, the packets can include a preamble, start frame delimiter, header, protocol specific data, and cyclic redundancy check. The FPGA can be configured to perform operations included in the initial computer code based on wires and gates. For example, the FPGA can be configured to send a reply a received data packet. In another example, the FPGA can be configured to match or filter data packets, forward data packets, or store data packets in the FPGA. In yet another example, the FPGA can be also reconfigured based on the information included in the received data packets.

Depending on a data transferring protocol, the data in packets are clocked at a specific rate. Per each clock only a certain input block of a data packet can be received by a FPGA, such that only a certain number of wires can be used in the FPGA. There is a strong correlation between the number of bits in the input and the corresponding number of wires and number of gates. For the same computer code, fewer gates and wires are needed for a bigger number of bits in the input. There is a linear dependency between the length of a data packet and a number of gates and wires, if the length of the packet is measured as the number of symbols in the packets. The number of symbols in the packet is inversely related to the number of bits in the input. For example, use of one-hot encoding, 8-bit input, and 256 separate wires may represent one of possible 0-255 numbers of input. In case of a transfer of data in packets via a gigabit media-independent interface (GMII) interface, each input block is single 8-bit/8-wire input at each clock cycle.

When using one-hot encoding and 84 states, one separate wire for each state may represent a symbol from 0 to 83. A transition from one state to another state may occur when 0 or 1 possible inputs are matched for each state. The state would not be advancing when inputs are failed to match the whole pattern. Given that there are only 84 possible states and 0 or 1 possible inputs per state, a maximum of 84 wires out of the 256 separate wires could possibly be used. In practice, the same input value can be used multiple times. For example, 0x55 can appear 7 times at the beginning of a packet. Because one input wire can be used multiple times and because there are states with 0 possible inputs such as in the packet ID field, the number of unique input wires that are used tends to be small. For common cases, the number of unique input wires can be 20 wires or less.

At each state, arranged in parallel, a single 8-bit symbol or nothing, is matched by combining the wires from the previous state, or signal in the beginning of the packet, and the wires corresponding to the input symbol, or nothing. Each state can be represented as one of the following:

1. firstStateInput<=packetStart AND inputWireN
2. firstStateInput<=packetStart. A case when no input is needed, or any input is acceptable.
3. currentStateInput<=previousStateN AND inputWireN
4. currentStateInput<=previousStateN. A case when no input is needed, or any input is acceptable.

In a general case, packetStart can be the zeroth state, causing the start of the first state. For states in which any input is acceptable, there is no input wire needed to be looked at. The multiple states that have no input wires looked at may be implemented as a shift register. Any states that are not stored in a flip-flop can be stored in a shift register because these states are not accessed individually.

In the case of transferring data in packets via a 10-gigabit media-independent interface (XGMII) interface, each symbol can be represented as 32 bits at each transition of a clock. When represented with one-hot encoding, the maximum number of wires to represent all possible 32 bits symbols is over 4 billion wires. However, the length of data packet is the same as in the case of a GMII interface. Assuming that there is only ¼ of the possible states and that one input symbol is 4 times larger than in the GMII interface, the number of wires is limited to the symbol count length of the packet, a minimum size being 84 bytes or ¼ that as symbols of 32 bits, ⅛ at 64 bit symbols, and so forth. There can be a fewer number due to redundancies.

Similar considerations can be used when using higher speed/symbol size inputs, such as in transferring protocols with rate of 25 MHz, 125 MHz, 156.25 MHz, 644.53125 MHz, 1.5625 GHz, and so forth. Generally, as the width of an input increases, the number of gates decreases.

When multiple similar packets are matched, the decisions may form a tree. Earlier states are shared in the tree. Each unique type of a packet to be matched requires a minimum of 1 additional gate to uniquely match the packet to the gate and have a maximum number of states not shared with other similar types of packets to match. Generally, when the number of packet matching rules is more than a hundred, as few as 1 or 2 additional gates are required to match a packet. In most cases, only 1 additional gate is needed for each additional matching rule.

Figure 6:
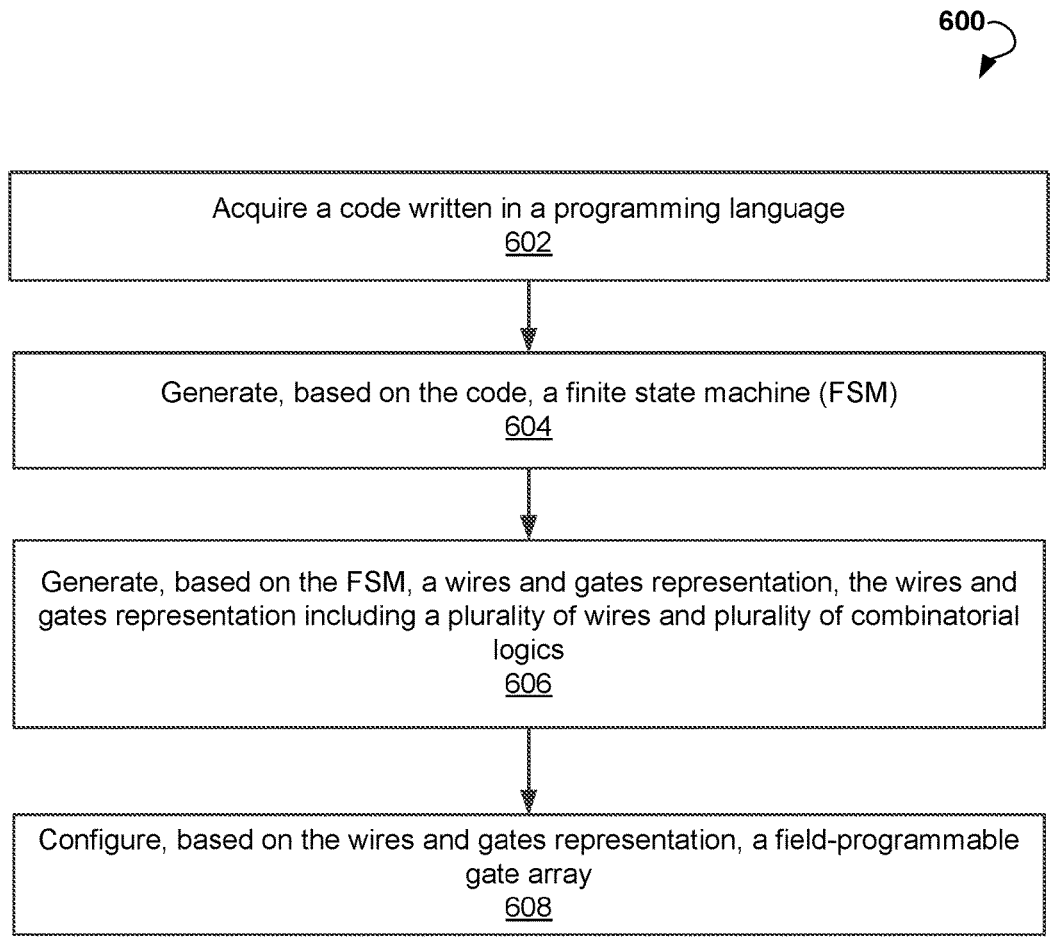
FIG. 6 is a flow chart showing a method for mapping a computer code to wires and gates, according to an example embodiment.

FIG. 6 is a flow chart showing a method 600 for mapping a computer code to wires and gates, according to some example embodiments. The method 600 can be implemented with a computer system. An example computer system is described below with reference to FIG. 4.

The method 600 may commence, in block 602, with acquiring a code. The code can be written in a programming language. The programming language can a high-level programming language, such as, for example, JavaScript, C, C++, domain specific language, and the like. The code can be written in terms of a technical specification. An example technical specification can include an RFC.

In block 604, the method 600 may generate, based on the code, an FSM. In block 606, the method 600 may proceed with generating, based on the FSM, a wires and gates representation. The wires and gates representation may include a plurality of wires and a plurality of combinatorial logics. An input of each of the plurality of wires may represent a symbol from a set of symbols of a structured data packet. The size of the symbol can be equal to a number of bits of the structured data packet transferred per clock cycle according to a data transmission protocol. The packet may include an Ethernet packet, OTN packet, or PCIE packet. The data transmission protocol may include a GMII, XGMII, and so forth. States arising from combinational logic may be stored in the flip flops or alternatively shift registers if the individual states from the flip-flops are not directly needed.

In block 608, the method 600 may include configuring, based on the wires and gates representation, a field-programmable gate array. Combinatorial logics that do not depend on input from wires of the plurality of wires can be implemented in a shift register. Other combinatorial logics can be stored in flip-flops.

Thus, systems and methods for mapping a computer code to wires and gates are disclosed. Although embodiments have been described with reference to specific example embodiments, it may be evident that various modifications and changes can be made to these example embodiments without departing from the broader spirit and scope of the present application. Accordingly, the specification and drawings are to be regarded in an illustrative rather than a restrictive sense.

What is claimed is:

1. A computer-implemented method for configuring at least one integrated circuit by mapping a computer code to wires and gates, the method comprising:
    acquiring a first code, the first code being written in a first language;
    parsing, via one or more parsing expression grammar (PEG) modules and based on a first grammar associated with the first language, the first code to convert the first code into a first abstract syntax tree (AST);
    converting the first AST into a first non-deterministic finite state machine (NFSM);
    converting the first NFSM into a first deterministic finite state machine (DFSM);
    optimizing the first DFSM to obtain a second DFSM;
    converting, via at least the one or more PEG modules, the second DFSM into a second code, the second code being written in a second language wherein the second code is a translation of the first code;
    generating, based on the second DFSM, a wires and gates representation, the wires and gates representation including a plurality of wires and plurality of combinatorial logics; and
    configuring, based on the wires and gates representation, at least one integrated circuit.

2. The method of claim 1, wherein the at least one integrated circuit comprises a field-programmable gate array or an application-specific integrated circuit.

3. The method of claim 2, further comprising:
    determining that one or more combinatorial logics of the plurality of combinatorial logics does not depend on input from wires of the plurality of wires; and
    in response to the determination, storing the one or more combinatorial logic in a shift register.

4. The method of claim 2, further comprising:
    determining that one or more combinatorial logics of the plurality of combinatorial logics depend on input from wires of the plurality of wires; and
    in response to the determination, storing the one or more combinatorial logics in flip-flops.

5. The method of claim 1, wherein input of each of the plurality of wires represents a symbol from a set of symbols of a structured data packet, a size of the symbol being equal to a number of bits of the structured data packet transferred per clock cycle according to a data transmission protocol.

6. The method of claim 5, wherein a number of gates and a number of wires in the wires and gates representation is optimized based on a rate of a transferring protocol or a structure of the structured data packet.

7. The method of claim 5, wherein the structured data packet incudes an ethernet packet, an optical transport network packet, or a peripheral component interconnect express packet.

8. The method of claim 1, wherein the first language includes a high-level programming language.

9. The method of claim 1, further comprising optimizing the first DFSM prior to generating the wires and gates representation.

10. The method of claim 9, wherein optimizing the first DFSM includes minimizing a number of states in a finite state machine.

11. A system for configuring at least one integrated circuit by mapping a computer code to wires and gates, the system comprising:
    at least one processor; and
    a memory communicatively coupled to the at least one processor, the memory storing instructions, which, when executed by the at least one processor, perform a method comprising:
    acquiring a first code, the first code being written in a first language;
    parsing, via one or more parsing expression grammar (PEG) modules and based on a first grammar associated with the first language, the first code to convert the first code into a first abstract syntax tree (AST);

converting the first AST into a first non-deterministic finite state machine (NFSM);

converting the first NFSM into a first deterministic finite state machine (DFSM);

optimizing the first DFSM to obtain a second DFSM;

converting, via at least the one or more PEG modules, the second DFSM into a second code, the second code being written in a second language wherein the second code is a translation of the first code;

generating, based on the second DFSM, a wires and gates representation, the wires and gates representation including a plurality of wires and a plurality of combinatorial logics; and configuring, based on the wires and gates representation, an integrated circuit.

12. The system of claim 11, wherein the at least one integrated circuit comprises a field-programmable gate array or an application-specific integrated circuit.

13. The system of claim 12, wherein the at least one processor is to:

determine that one or more combinatorial logics of the plurality of combinatorial logics does not depend on input from wires of the plurality of wires; and in response to the determination, store the one or more combinatorial logic in a shift register.

14. The system of claim 12, wherein the at least one processor is to:

determine that one or more combinatorial logics of the plurality of combinatorial logics depend on input from wires of the plurality of wires; and in response to the determination, store the one or more combinatorial logic in flip-flops.

15. The system of claim 11, wherein an input of each of the plurality of wires represents a symbol selected from a set of symbols of a structured data packet, a size of the symbol being equal to a number of bits of the structured data packet transferred per clock cycle according to a data transmission protocol.

16. The system of claim 15, wherein a number of gates and a number of wires in the wires and gates representation is optimized based on a rate of a transferring protocol or a structure of the structured data packet.

17. The system of claim 15, wherein the structured data packet incudes an ethernet packet, an optical transport network packet, or a peripheral component interconnect express packet.

18. The system of claim 11, wherein the first language is a high-level programming language.

19. The system of claim 11, wherein the at least one processor is to optimize the first DFSM prior to generating the wires and gates representation.

20. A non-transitory computer-readable storage medium having embodied thereon instructions, which, when executed by one or more processors, perform a method for configuring at least one integrated circuit by mapping a computer code to wires and gates, the method comprising:

acquiring a first code, the first code being written in a first language;

parsing, via one or more parsing expression grammar (PEG) modules and based on a first grammar associated with the first language, the first code to convert the first code into a first abstract syntax tree (AST);

converting the first AST into a first non-deterministic finite state machine (NFSM);

converting the first NFSM into a first deterministic finite state machine (DFSM);

optimizing the first DFSM to obtain a second DFSM;

converting, via at least the one or more PEG modules, the second DFSM into a second code, the second code being written in a second language wherein the second code is a translation of the first code;

generating, based on the second DFSM, a wires and gates representation, the wires and gates representation including a plurality of wires and plurality of combinatorial logics; and configuring, based on the wires and gates representation, at least one integrated circuit.

* * * * *